United States Patent
Paquette et al.

(10) Patent No.: US 8,363,413 B2
(45) Date of Patent: Jan. 29, 2013

(54) ASSEMBLY TO PROVIDE THERMAL COOLING

(75) Inventors: Jeffrey Paquette, Wakefield, MA (US); Scott R. Cheyne, Brookline, NH (US); Joseph R. Ellsworth, Worcester, MA (US)

(73) Assignee: Raytheon Company, Waltham, MA (US)

( * ) Notice: Subject to any disclaimer, the term of this patent is extended or adjusted under 35 U.S.C. 154(b) by 169 days.

(21) Appl. No.: 12/880,350

(22) Filed: Sep. 13, 2010

(65) Prior Publication Data

US 2012/0063098 A1  Mar. 15, 2012

(51) Int. Cl.
H05K 7/20 (2006.01)

(52) U.S. Cl. ....... 361/721; 361/699; 361/702; 174/15.1; 165/80.4

(58) Field of Classification Search .......................... None
See application file for complete search history.

(56) References Cited

U.S. PATENT DOCUMENTS

| | | | |
|---|---|---|---|
| 3,091,743 A | 5/1963 | Wilkinson | |
| 3,665,480 A | 5/1972 | Fassett | |
| 4,489,363 A | 12/1984 | Goldberg | |
| 4,527,165 A | 7/1985 | deRonde | |
| 4,698,663 A | 10/1987 | Sugimoto et al. | |
| 4,706,094 A | 11/1987 | Kubick | |
| 4,740,866 A * | 4/1988 | Kajiwara et al. | 361/702 |
| 4,751,513 A | 6/1988 | Daryoush et al. | |
| 4,759,403 A * | 7/1988 | Flint et al. | 165/80.4 |
| 4,835,658 A | 5/1989 | Bonnefoy | |
| 5,005,019 A | 4/1991 | Zaghloul et al. | |
| 5,055,852 A | 10/1991 | Dusseux et al. | |
| 5,099,254 A | 3/1992 | Tsukii et al. | |
| 5,166,863 A * | 11/1992 | Shmunis | 361/699 |
| 5,276,455 A | 1/1994 | Fitzsimmons et al. | |
| 5,309,319 A * | 5/1994 | Messina | 361/699 |
| 5,398,010 A | 3/1995 | Klebe | |
| 5,400,040 A | 3/1995 | Lane et al. | |
| 5,404,148 A | 4/1995 | Zwarts | |
| 5,451,969 A | 9/1995 | Toth et al. | |
| 5,459,474 A | 10/1995 | Mattioli et al. | |
| 5,465,192 A * | 11/1995 | Yoshikawa | 361/705 |
| 5,488,380 A | 1/1996 | Harvey et al. | |

(Continued)

FOREIGN PATENT DOCUMENTS

EP  0 481 417 A  4/1992
EP  1 764 863 A1  3/2007

(Continued)

OTHER PUBLICATIONS

International Preliminary Report on Patentability of the ISA for PCT/US2010/026861 dated Oct. 6, 2011.

(Continued)

*Primary Examiner* — Boris Chervinsky
(74) *Attorney, Agent, or Firm* — Daly, Crowley, Mofford & Durkee, LLP (57) ABSTRACT

In one aspect, an assembly to provide thermal cooling includes a first member having a first channel configured to receive a cooling fluid, a second member having a second channel configured to receive the cooling fluid and a first plurality of hollow and flexible conduits connecting the first and second members. Each of the first plurality of hollow and flexible conduits is configured to provide a path for the cooling fluid to flow between the first and second channels.

6 Claims, 6 Drawing Sheets

U.S. PATENT DOCUMENTS

| | | | |
|---|---|---|---|
| 5,493,305 A | 2/1996 | Wooldridge et al. | |
| 5,537,291 A * | 7/1996 | Onodera et al. | 361/699 |
| 5,563,613 A | 10/1996 | Schroeder et al. | |
| 5,592,363 A | 1/1997 | Atarashi et al. | |
| 5,646,826 A | 7/1997 | Katchmar | |
| 5,675,345 A | 10/1997 | Pozgay et al. | |
| 5,724,048 A | 3/1998 | Remondiere | |
| 5,786,792 A | 7/1998 | Bellus et al. | |
| 5,796,582 A | 8/1998 | Katchmar | |
| 5,854,607 A | 12/1998 | Kinghorn | |
| 5,907,304 A | 5/1999 | Wilson et al. | |
| 6,011,507 A | 1/2000 | Curran et al. | |
| 6,037,903 A | 3/2000 | Lange et al. | |
| 6,061,027 A | 5/2000 | Legay et al. | |
| 6,078,289 A | 6/2000 | Manoogian et al. | |
| 6,087,988 A | 7/2000 | Pozgay | |
| 6,091,373 A | 7/2000 | Raguenet | |
| 6,104,343 A | 8/2000 | Brookner et al. | |
| 6,127,985 A | 10/2000 | Guler | |
| 6,166,705 A | 12/2000 | Mast et al. | |
| 6,181,280 B1 | 1/2001 | Kadambi et al. | |
| 6,184,832 B1 | 2/2001 | Geyh et al. | |
| 6,208,316 B1 | 3/2001 | Cahill | |
| 6,211,824 B1 | 4/2001 | Holden et al. | |
| 6,218,214 B1 | 4/2001 | Panchou et al. | |
| 6,222,493 B1 | 4/2001 | Caille et al. | |
| 6,225,695 B1 | 5/2001 | Chia et al. | |
| 6,297,775 B1 | 10/2001 | Haws et al. | |
| 6,388,620 B1 | 5/2002 | Bhattacharyya | |
| 6,392,890 B1 | 5/2002 | Katchmar | |
| 6,424,313 B1 | 7/2002 | Navarro et al. | |
| 6,480,167 B2 | 11/2002 | Matthews | |
| 6,483,705 B2 | 11/2002 | Snyder et al. | |
| 6,580,402 B2 | 6/2003 | Navarro et al. | |
| 6,611,180 B1 | 8/2003 | Puzella et al. | |
| 6,621,470 B1 | 9/2003 | Boeringer et al. | |
| 6,624,787 B2 | 9/2003 | Puzella et al. | |
| 6,661,376 B2 | 12/2003 | Maceo et al. | |
| 6,670,930 B2 | 12/2003 | Navarro | |
| 6,686,885 B1 | 2/2004 | Barkdoll et al. | |
| 6,703,976 B2 | 3/2004 | Jacomb-Hood et al. | |
| 6,711,814 B2 | 3/2004 | Barr et al. | |
| 6,731,189 B2 | 5/2004 | Puzella et al. | |
| 6,756,684 B2 | 6/2004 | Huang | |
| 6,856,210 B2 | 2/2005 | Zhu et al. | |
| 6,900,765 B2 | 5/2005 | Navarro et al. | |
| 6,943,330 B2 | 9/2005 | Ring | |
| 6,961,248 B2 | 11/2005 | Vincent et al. | |
| 6,995,322 B2 | 2/2006 | Chan et al. | |
| 7,030,712 B2 | 4/2006 | Brunette et al. | |
| 7,061,446 B1 | 6/2006 | Short, Jr. et al. | |
| 7,129,908 B2 | 10/2006 | Edward et al. | |
| 7,132,990 B2 | 11/2006 | Stenger et al. | |
| 7,180,745 B2 | 2/2007 | Mandel et al. | |
| 7,187,342 B2 | 3/2007 | Heisen et al. | |
| 7,298,235 B2 | 11/2007 | Hauhe et al. | |
| 7,298,617 B2 * | 11/2007 | Campbell et al. | 361/699 |
| 7,298,618 B2 * | 11/2007 | Campbell et al. | 361/699 |
| 7,348,932 B1 | 3/2008 | Puzella et al. | |
| 7,385,821 B1 * | 6/2008 | Feierbach | 361/705 |
| 7,417,598 B2 | 8/2008 | Navarro et al. | |
| 7,443,354 B2 | 10/2008 | Navarro et al. | |
| 7,444,737 B2 | 11/2008 | Worl | |
| 7,489,283 B2 | 2/2009 | Ingram et al. | |
| 7,508,338 B2 | 3/2009 | Pluymers et al. | |
| 7,597,534 B2 | 10/2009 | Hopkins | |
| 7,671,696 B1 | 3/2010 | Puzella et al. | |
| 2002/0051342 A1 | 5/2002 | Kanada | |
| 2005/0110681 A1 | 5/2005 | Londre | |
| 2005/0180107 A1 * | 8/2005 | Naganawa et al. | 361/699 |
| 2006/0268518 A1 | 11/2006 | Edward et al. | |
| 2007/0152882 A1 | 7/2007 | Hash et al. | |
| 2008/0106467 A1 | 5/2008 | Navarro et al. | |
| 2008/0106482 A1 | 5/2008 | Cherrette et al. | |
| 2008/0150832 A1 | 6/2008 | Ingram et al. | |
| 2008/0316139 A1 | 12/2008 | Blaser et al. | |

FOREIGN PATENT DOCUMENTS

| | | |
|---|---|---|
| EP | 1 436 859 B1 | 8/2007 |
| EP | 1 978 597 A1 | 10/2008 |
| JP | 61224504 | 10/1986 |
| JP | 4-122107 A | 4/1992 |
| JP | 06-097710 | 4/1994 |
| JP | 07-212125 | 8/1995 |
| JP | 2000-138525 A | 5/2000 |
| JP | 2003 179429 A | 6/2003 |
| JP | 2005 505963 | 2/2005 |
| KR | 1020010079872 A | 8/2001 |
| WO | WO 98/26642 | 6/1998 |
| WO | WO 99/66594 | 12/1999 |
| WO | WO 01/06821 A1 | 1/2001 |
| WO | WO 01/20720 A1 | 3/2001 |
| WO | WO 01/33927 A1 | 5/2001 |
| WO | WO 01/41257 A1 | 6/2001 |
| WO | WO 03/003031 A1 | 4/2003 |
| WO | WO 2007/136941 A2 | 11/2007 |
| WO | WO 2007/136941 A3 | 11/2007 |
| WO | WO 2008/010851 A2 | 1/2008 |
| WO | WO 2008/010851 A3 | 1/2008 |
| WO | WO 2008/036469 A1 | 3/2008 |

OTHER PUBLICATIONS

Bash et al,; "Improving Heat Transfer From a Flip-Chip Package;" Technology Industry; Email Alert RSS Feed; Hewlett-Packard Journal, Aug. 1997; 3 pages.

Carter; "'Fuzz Button' Interconnects at Microwave and MM-Wave Frequencies;" IEEE Seminar; London, UK; Mar. 1-6, 2000; 7 sheets.

Jerinic, et al.; "X-Band "Tile" Array for Mobile Radar;" internal Raytheon Company publication; Spring 2003; 4 pages.

Marsh et al.; "5.4 Watt GaAs MESFET MMIC for Phased Array Radar Systems;" 1997 Workshop on High Performance Electron Devices for Microwave and Optoelectronic Applications, Nov. 24-25, 1997; pp. 169-174.

Div. Application (with translation of amended claims) as filed on Dec. 1, 2008 in Korean Intellectual Property Office and assigned App. No. 10-2008-7029396.

Decision of Rejection dated Jul. 30, 2008 from KR Pat. App. No. 10-2004-7003900.

Notice of Trial Decision dated Mar. 23, 2010 from KR Pat. App. No. 10-2004-7003900.

EP Search Report for 06021905.2; dated Feb. 9, 2007; 8 pages.

European Office Action dated Nov. 3, 2005 from EP Pat. App. No. 02800372.1.

Response to European Office Action filed Jan. 12, 2007 from EP Pat. App. No. 02800372.1.

European Office Action dated Oct. 18, 2007 from EPO Pat. App. No. 06021905.2.

Response to European Office Action dated Oct. 18, 2007 filed in the EPO on Aug. 11, 2008 from EP Pat. App. No. 06021905.2.

Response to European Office Action dated Mar. 19, 2009 filed in the EPO on Nov. 19, 2009 from EP Pat. App. No. 06021905.2.

European Office Action dated Feb. 18, 2010 from EPO Pat. App. No. 06021905.2.

Notice of Allowance dated Feb. 2, 2007 from EP Pat. App. No. 02800372.1.

Korean Office Action dated Oct. 31, 2007 from KR Pat. App. No. 10-2004-7003900.

Response to Korean Office Action filed Mar. 26, 2008 from KR Pat. App. No. 10-2004-7003900.

Korean Office Action dated Feb. 25, 2009 from KR Pat. App. No. 10-2008-7029396.

Korean Office Action dated Nov. 27, 2009 from KR Pat. App. No. 10-2008-7029396.

Japanese Office Action dated Mar. 7, 2007 from JP Pat. App. No. 2003-533378.

Japanese Office Action dated Feb. 15, 2008 from JP Pat. App. No. 2003-533378.

Japanese Office Action dated Feb. 18, 2009 from JP Pat. App. No. 2003-533378.

Response to Japanese Office Action filed Jul. 5, 2007 from JP App. No. 2003-533378.
Response to Japanese Office Action filed Jun. 19, 2009 from App JP App. No. 2003-533378.
Office Action dated Jun. 11, 2010 from U.S. Appl. No. 12/694,450.
Response to Office Action of Jun. 11, 2010 from U.S. Appl. No. 12/694,450 dated Sep. 21, 2010.
Notice of Allowance dated Nov. 3, 2010 from U.S. Appl. No. 12/482,061.
Office action dated Dec. 1, 2010 from U.S. Appl. No. 12/694,450.
PCT Search Report of the ISA for PCT/US2010/026861 dated Jun. 18, 2010; 6 pages.
PCT Written Opinion of the ISA for PCT/US2010/026861 dated Jun. 18, 2010; 5 pages.
PCT International Preliminary Examination Report and Written Opinion of the ISA for PCT/US2002/30677 dated Nov. 27, 2003; 10 pages.
PCT Search Report mailed on Dec. 19, 2007 for PCT Pat. App. No. PCT/US2007/074795 filed on Jul. 31, 2007.
PCT Written Opinion mailed on Dec. 19, 2007 for PCT Pat. App. No. PCT/US2007/074795 filed on Jul. 31, 2007.
PCT International Preliminary Examination Report mailed on Apr. 2, 2009 for PCT Pat. App. No. PCT/US2007/074795 filed on Jul. 31, 2007.
U.S. Appl. No. 12/694,450, filed Jan. 27, 2010, file through Dec. 8, 2010, 312 pages.
U.S. Appl. No. 12/484,626, filed Jun. 15, 2009, file through Dec. 8, 2020, 312 pages.
U.S. Appl. No. 12/482,061, filed Jun. 10, 2009, file through Dec. 8, 2010, 196 pages.
U.S. Appl. No. 12/566,818, filed Sep. 25, 2009, file through Dec. 8, 2010, 129 pages.
U.S. Appl. No. 12/580,356, filed Oct. 16, 2009, file through Dec. 14, 2010, 148 pages.
Response to Office Action of Dec. 1, 2010 from U.S. Appl. No. 12/694,450 dated Jan. 25, 2011.
PCT Search Report of the ISA for PCT/US2010/049261 dated Feb. 7, 2011.
Written Opinion of the ISA for PCT/US2010/049261 dated Feb. 7, 2011.
Office Action dated Mar. 23, 2011 from U.S. Appl. No. 12/694,450.

* cited by examiner

ASSEMBLY TO PROVIDE THERMAL COOLING

BACKGROUND

As is known in the art, a phased array antenna includes a plurality of active circuits spaced apart from each other by known distances. Each of the active circuits is coupled through a plurality of phase shifter circuits, amplifier circuits and/or other circuits to either or both of a transmitter and receiver. In some cases, the phase shifter, amplifier circuits and other circuits (e.g., mixer circuits) are provided in a so-called transmit/receive (T/R) module and are considered to be part of the transmitter and/or receiver.

The phase shifters, amplifier and other circuits (e.g., T/R modules) often require an external power supply (e.g., a DC power supply) to operate correctly. Thus, the circuits are referred to as "active circuits" or "active components." Accordingly, phased array antennas which include active circuits are often referred to as "active phased arrays."

Active circuits dissipate power in the form of heat. High amounts of heat can cause active circuits to be inoperable. Thus, active phased arrays must be cooled. In one example heat-sink(s) are attached to each active circuit to dissipate the heat.

SUMMARY

In one aspect, an assembly to provide thermal cooling includes a first member having a first channel configured to receive a cooling fluid, a second member having a second channel configured to receive the cooling fluid and a first plurality of hollow and flexible conduits connecting the first and second members. Each of the first plurality of hollow and flexible conduits is configured to provide a path for the cooling fluid to flow between the first and second channels.

In another aspect, an active, electronically scanned array (AESA) panel architecture system includes a first daughter board that includes antenna elements; a first thermal spreader attached to the antenna elements; a circuit board assembly; and a cold plate assembly in contact with the first thermal spreader. The cold plate assembly includes a first cold plate having a first channel configured to receive a cooling fluid, a second cold plate having a second channel configured to receive the cooling fluid and a first plurality of hollow and flexible conduits connecting the first and second cold plates. Each of the first plurality of hollow and flexible conduits is configured to provide a path for the cooling fluid to flow between the first and second channels.

In a further aspect, a method to provide thermal cooling includes using a first plurality of hollow and flexible conduits to connect a first cold plate having a first channel configured to receive a cooling fluid and a second cold plate having a second channel configured to receive the cooling fluid. The method further includes configuring each of the first plurality of hollow and flexible conduits to provide a path for the cooling fluid to flow between the first and second channels.

DETAILED DESCRIPTION

A "panel array" (or more simply "panel") refers to a multilayer printed wiring board (PWB) which includes an array of active circuits (or more simply "radiating elements" or "radiators"), as well as RF, logic and DC distribution circuits configured into highly integrated PWB(s). A panel is also sometimes referred to herein as a tile array (or more simply, a "tile").

An array antenna may be provided from a single panel (or tile) or from a plurality of panels. In the case where an array antenna is provided from a plurality of panels, a single one of the plurality of panels is sometimes referred to herein as a "panel sub-array" (or a "tile sub-array").

Reference is sometimes made herein to an array antenna having a particular number of panels. It should of course, be appreciated that an array antenna may be comprised of any number of panels and that one of ordinary skill in the art will appreciate how to select the particular number of panels to use in any particular application.

It should also be noted that reference is sometimes made herein to a panel or an array antenna having a particular array shape and/or physical size or a particular number of active circuits. One of ordinary skill in the art will appreciate that the techniques described herein are applicable to various sizes and shapes of panels and/or array antennas and that any number of active circuits may be used.

Similarly, reference is sometimes made herein to panel or tile sub-arrays having a particular geometric shape (e.g., square, rectangular, round) and/or size (e.g., a particular number of active circuits) or a particular lattice type or spacing of active circuits. One of ordinary skill in the art will appreciate that the techniques described herein are applicable to various sizes and shapes of array antennas as well as to various sizes and shapes of panels (or tiles) and/or panel sub-arrays (or tile sub-arrays).

Thus, although the description provided herein below describes the inventive concepts in the context of an array antenna having a substantially square or rectangular shape and comprised of a plurality of tile sub-arrays having a substantially square or rectangular-shape, those of ordinary skill in the art will appreciate that the concepts equally apply to other sizes and shapes of array antennas and panels (or tile sub-arrays) having a variety of different sizes, shapes, and types of elements. Also, the panels (or tiles) may be arranged in a variety of different lattice arrangements including, but not limited to, periodic lattice arrangements or configurations (e.g., rectangular, circular, equilateral or isosceles triangular and spiral configurations) as well as non-periodic or other geometric arrangements including arbitrarily shaped array geometries.

Reference is also sometimes made herein to the array antenna including an antenna element (active circuit) of a particular type, size and/or shape. For example, one type of radiating element is a so-called patch antenna element having a square shape and a size compatible with operation at a particular frequency (e.g., 10 GHz) or range of frequencies (e.g., the X-band frequency range). Reference is also sometimes made herein to a so-called "stacked patch" antenna element. Those of ordinary skill in the art will recognize, of course, that other shapes and types of antenna elements (e.g., an antenna element other than a stacked patch antenna element) may also be used and that the size of one or more active circuits may be selected for operation at any frequency in the RF frequency range (e.g., any frequency in the range of about 1 GHz to about 100 GHz). The types of radiating elements which may be used in the antenna of the present invention include but are not limited to notch elements, dipoles, slots or any other antenna elements (regardless of whether the antenna element is a printed circuit element) known to those of ordinary skill in the art.

It should also be appreciated that the active circuits in each panel or tile sub-array can be provided having any one of a plurality of different antenna element lattice arrangements including periodic lattice arrangements (or configurations) such as rectangular, square, triangular (e.g., equilateral or isosceles triangular), and spiral configurations as well as non-periodic or arbitrary lattice arrangements.

Applications of at least some examples of the panel array (sometimes referred to as a "tile array") architectures described herein include, but are not limited to, radar, electronic warfare (EW) and communication systems for a wide variety of applications including ship based, airborne, missile and satellite applications. It should thus be appreciated that the panel (or tile sub-array) described herein can be used as part of a radar system or a communications system.

At least some examples as described herein are applicable, but not limited to, military, airborne, shipborne, communications, unmanned aerial vehicles (UAV) and/or commercial wireless applications.

The tile sub-arrays to be described herein below can also utilize embedded circulators; a slot-coupled, polarized egg-crate radiator; a single integrated monolithic microwave integrated circuit (MMIC); and a passive radio frequency (RF) circuit architecture. For example, as described further herein, technology described in the following commonly assigned United States Patents can be used in whole or in part and/or adapted to be used with at least some embodiments of the tile subarrays described herein: U.S. Pat. No. 6,611,180, entitled "Embedded Planar Circulator"; U.S. Pat. No. 6,624,787, entitled "Slot Coupled, Polarized, Egg-Crate Radiator"; and/or U.S. Pat. No. 6,731,189, entitled "Multilayer stripline radio frequency circuits and interconnection methods." Each of the above patents is hereby incorporated herein by reference in their entireties.

Figure 1:
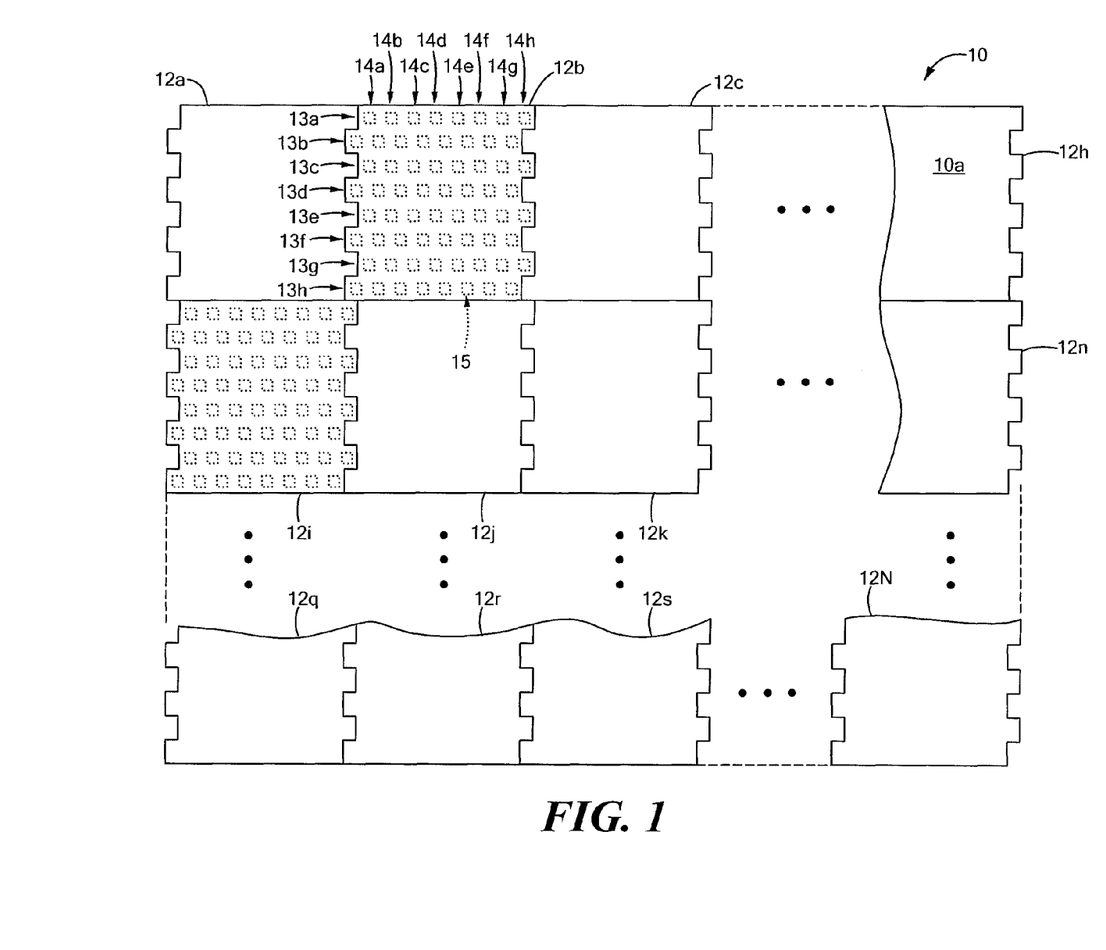
FIG. 1 is a plan view of an array antenna formed from a plurality of tile sub-arrays.

Referring now to FIG. 1, an array antenna 10 is comprised of a plurality of tile sub-arrays 12a-12N. It should be appreciated that in this example, N total tile sub-arrays 12 include the entire array antenna 10. In one particular example, the total number of tile sub-arrays is sixteen tile sub-arrays (i.e., N=16). The particular number of tile sub-arrays 12 used to provide a complete array antenna can be selected in accordance with a variety of factors including, but not limited to, the frequency of operation, array gain, the space available for the array antenna and the particular application for which the array antenna 10 is intended to be used. Those of ordinary skill in the art will appreciate how to select the number of tile sub-arrays 12 to use in providing a complete array antenna.

As illustrated in tiles 12b and 12i, in the example of FIG. 1, each tile sub-array 12a-12N includes eight rows 13a-13h of active circuits 15 (also known as antenna elements) with each row containing eight active circuits 15. Each of the tile sub-arrays 12a-12N is thus said to be an eight by eight (or 8×8) tile sub-array. It should be noted that each active circuit 15 is shown in phantom in FIG. 1 since the active circuits 15 are not directly visible on the exposed surface (or front face) of the array antenna 10. Thus, in this particular example, each tile sub-array 12a-12N includes sixty-four (64) active circuits. In the case where the array 10 includes sixteen (16) such tiles, the array 10 includes a total of one-thousand and twenty-four (1,024) active circuits 15.

In another example, each of the tile sub-arrays 12a-12N includes 16 active circuits. Thus, in the case where the array 10 includes sixteen (16) such tiles and each tile includes sixteen (16) active circuits 15, the array 10 includes a total of two-hundred and fifty-six (256) active circuits 15.

In view of the above examples, it should thus be appreciated that each of the tile sub-arrays can include any desired number of active circuits 15. The particular number of active circuits to include in each of the tile sub-arrays 12a-12N can be selected in accordance with a variety of factors including but not limited to the desired frequency of operation, array gain, the space available for the antenna and the particular application for which the array antenna 10 is intended to be used and the size of each tile sub-array 12. For any given application, those of ordinary skill in the art will appreciate how to select an appropriate number of radiating active circuits to include in each tile sub-array. The total number of active circuits 15 included in an antenna array such as antenna array 10 depends upon the number of tiles included in the antenna array and as well as the number of active circuits included in each tile.

Each tile sub-array is electrically autonomous (except any mutual coupling which occurs between active circuits 15 within a tile and on different tiles). Thus, the RF feed circuitry which couples RF energy to and from each radiator on a tile is incorporated entirely within that tile (i.e., all of the RF feed and beamforming circuitry which couples RF signals to and from active circuits 15 in tile 12b are contained within tile 12b). In one example, each tile includes one or more RF connectors and the RF signals are provided to the tile through the RF connector(s) provided on each tile sub-array.

Also, signal paths for logic signals and signal paths for power signals which couple signals to and from transmit/receive (T/R) circuits are contained within the tile in which the T/R circuits exist. RF signals are provided to the tile through one or more RF connectors provided on the tile sub-array.

The RF beam for the entire array 10 is formed by an external beamformer (i.e., external to each of the tile subarrays 12) that combines the RF outputs from each of the tile sub-arrays 12a-12N. As is known to those of ordinary skill in the art, the beamformer may be conventionally implemented as a printed wiring board stripline circuit that combines N sub-arrays into M RF signal port(s) (and hence the beamformer may be referred to as a N:M beamformer).

It should be appreciated that the examples of the tile sub-arrays described herein (e.g., tile sub-arrays 12a-12N) differ from conventional array architectures in that the microwave circuits of the tile sub-arrays are contained in circuit layers which are disposed in planes that are parallel to a plane defined by a face (or surface) of an array antenna (e.g., surface 10a of array antenna 10) made up from the tiles. In FIG. 1, for example, the circuits 15 provided on the layers of circuit boards from which the tiles 12a-12N are provided are all parallel to the surface 10a of array antenna 10. By utilizing circuit layers that are parallel to a plane defined by a face of an array antenna, the tile architecture approach results in an array antenna having a reduced profile (i.e., a thickness which is reduced compared with the thickness of conventional array antennas).

Advantageously, the tile sub-array embodiments described herein can be manufactured using standard printed wiring board (PWB) manufacturing processes to produce highly integrated, passive RF circuits, using commercial, off-theshelf (COTS) microwave materials, and highly integrated, active monolithic microwave integrated circuits (MMIC's). This results in reduced manufacturing costs. Array antenna manufacturing costs can also be reduced since the tile sub-arrays can be provided from relatively large panels or sheets of PWBs using conventional PWB manufacturing techniques.

Figure 2A:
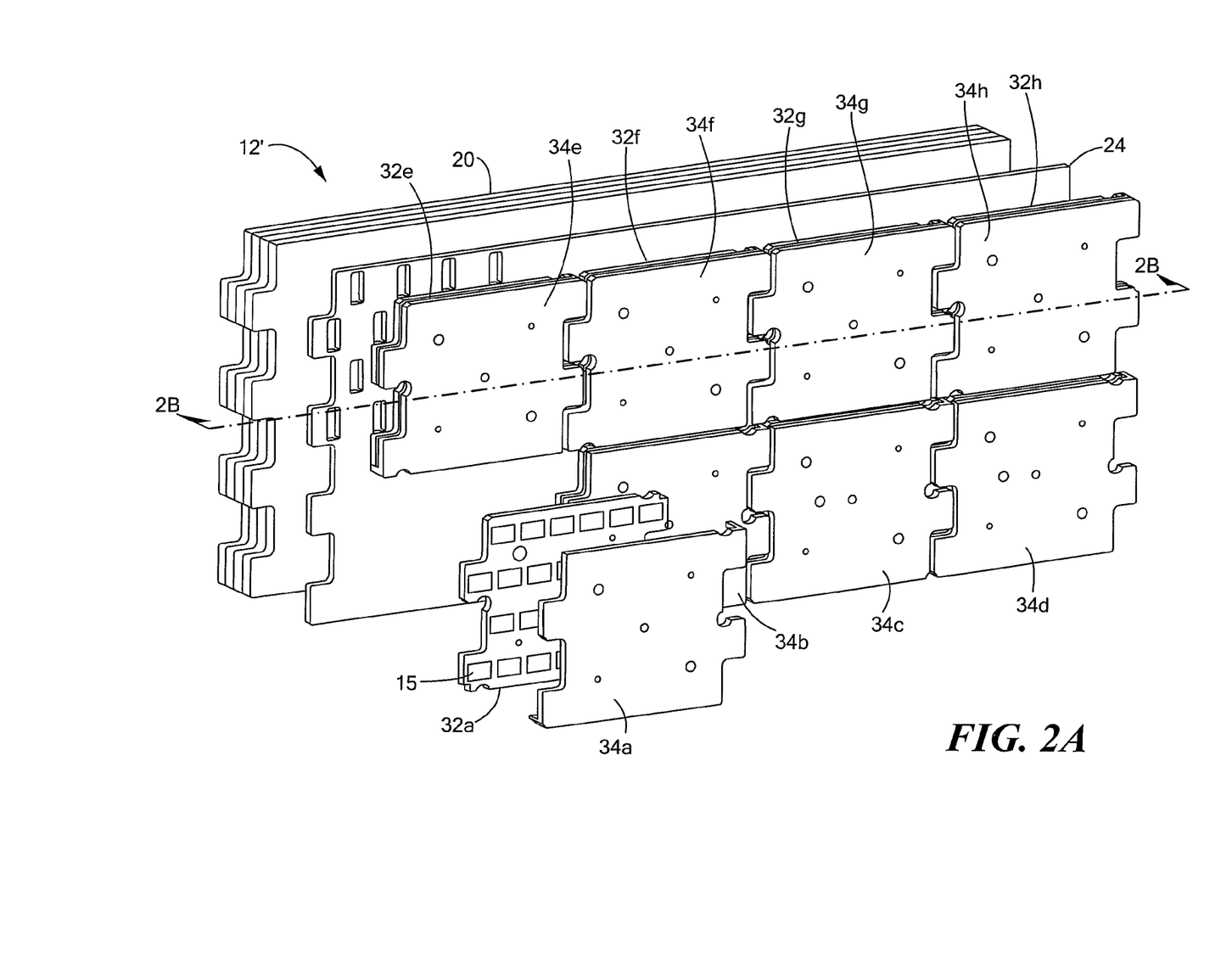
FIG. 2A is a partially exploded perspective view of an example of a tile sub-array.
Figure 2B:
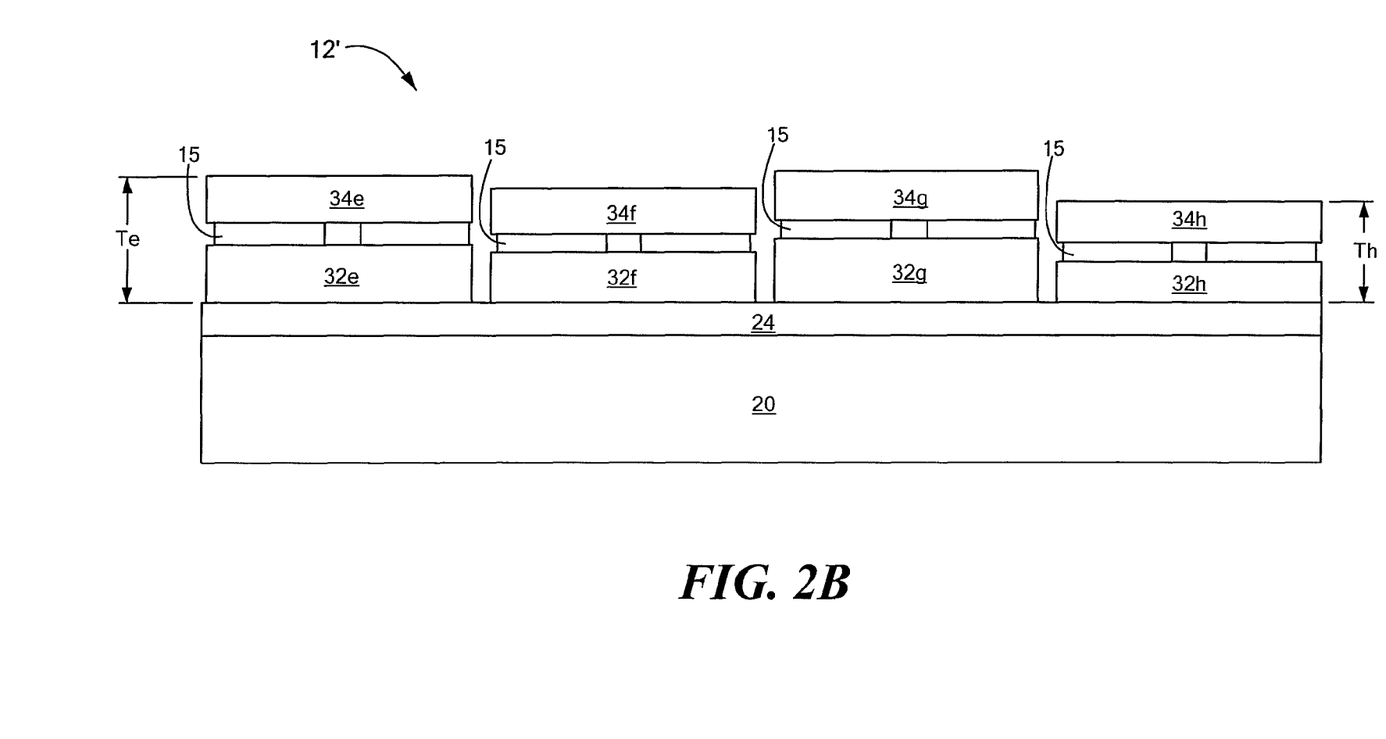
FIG. 2B is a cross-sectional view of the tile sub-array of FIG. 2A taken along lines 2B-2B.

Referring to FIGS. 2A and 2B, in one particular example of the tile sub-arrays 12a-12N is a tile sub-array 12'. The tile sub-array 12' includes a mother board 20, an RF interface board 24, eight daughter cards (e.g., a daughter card 32a-32h) with active circuits 15 on each daughter card and eight thermal spreaders (e.g., a thermal spreader 34a-34h) attached to active circuits 15 of a corresponding daughter card. In one example, the active circuits 15 are secured to the thermal spreaders 34a-34h using solder techniques described in U.S. patent application Ser. No. 12/580,356 entitled "Cooling Active Circuits" which is incorporated herein in it entirety.

In one example, each daughter card 32a-32h includes sixteen active circuits 15. Instead of having one large daughter card with active circuits 15 connected to one thermal spreader, this configuration increases yield during manufacturing by reducing the size of the daughter card into smaller pieces. In addition, it is easier to rework problems with smaller daughter cards as opposed to larger one piece daughter cards. For example, it is more cost effective to throw away sixteen active circuits 15 because of an active circuit failure than one hundred twenty-eight active circuits.

Cooling a number of substantially coplanar active circuits 15 (e.g., integrated circuits) with a single cold plate in direct contact with top surfaces of the thermal spreaders 34a-34h is difficult because of the many tolerances that exist resulting from height variations (thicknesses). For example, the active circuits 15, the thermal spreaders 34 and the daughter card 32 may have different thicknesses. For example, with respect to FIG. 2B, the thickness, $T_h$, which includes thicknesses of the thermal spreader 34h and the daughter card 32h is different from the thickness, $T_e$, which includes thicknesses of the thermal spreader 34e and the daughter card 32e. In one particular example, the daughter cards 32a-32h have a thickness tolerances of +/−0.015 inches and the thermal spreader 34a-34h have a thickness tolerances of +/−0.005 inches resulting in a total thickness tolerance of +/−0.020 inches.

As described herein, a cold plate assembly that includes a corresponding cold plate for each daughter card/active circuit/thermal subassembly and hollow and flexible conduits between these corresponding cold plates and a large cold plate may be used to compensate for varying thicknesses between the daughter card and thermal spreader subassemblies. While this disclosure describes cooling active circuits in an environment of an active, electronically scanned array (AESA) panel architecture system, the techniques described herein may be used in any environment to cool multiple objects of varying thicknesses and/or substantially coplanar.

Figure 3:
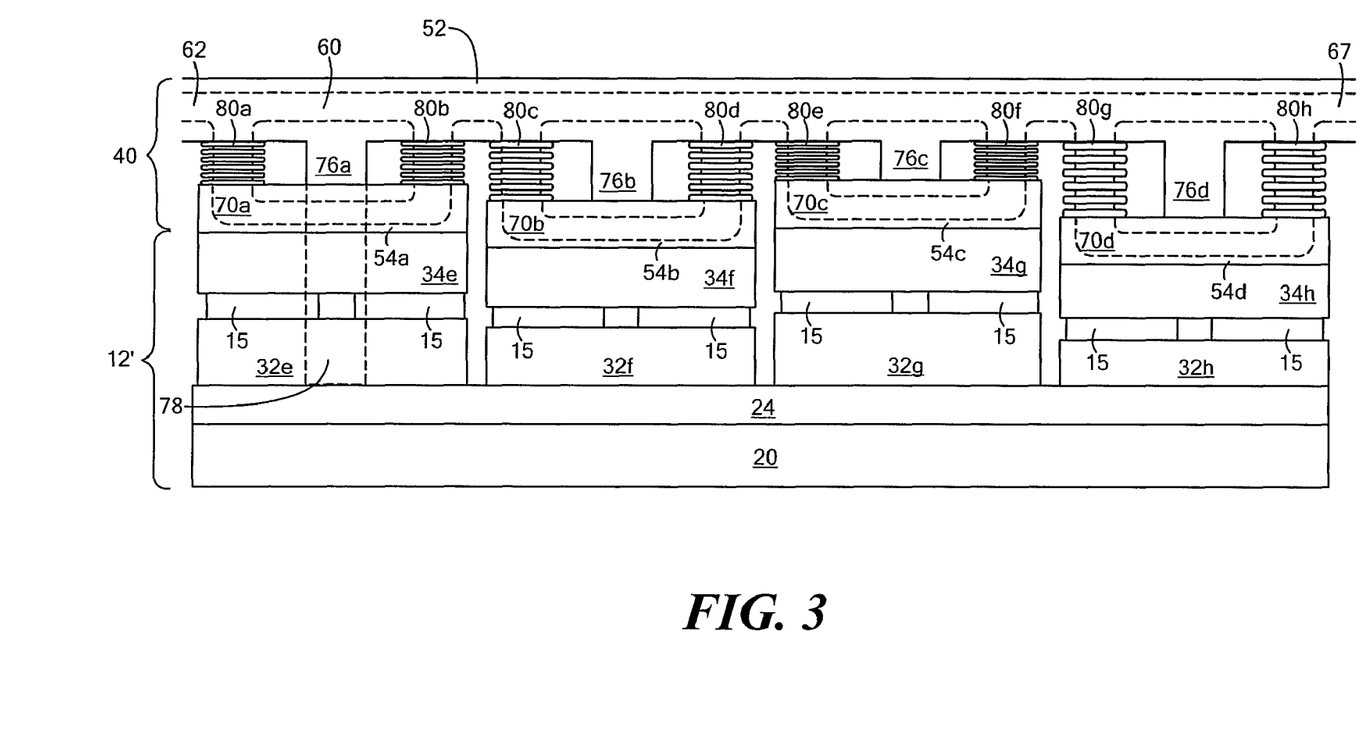
FIG. 3 is a cross-sectional view of the tile sub-array of FIG. 2B with one example of a cold plate assembly.

Referring to FIG. 3, a cold plate assembly 40 may be used to cool the tile sub-array 12'. In one example, the cold plate assembly 40 is connected to the thermal spreaders 34a-34h with or without a thermal interface material (e.g., a thermal grease) between the cold plate assembly and the thermal spreaders. The cold plate assembly 40 includes a large cold plate 52; eight small cold plates (of which only cold plates 54a-54d are visible in FIG. 3), one small cold plate 54 for each daughter card/active circuit/thermal spreader subassembly; eight bosses (of which only bosses 76a-76d are visible in FIG. 3) and sixteen hollow and flexible conduits (of which only conduits 80a-80h are visible in FIG. 3). The large cold plate 52 includes a channel 60 for receiving cooling fluid (coolant). In one example, the large cold plate 52 receives cooling fluid from a port 62 and discharges cooling fluid from the port 64. Each of the small plates 54a-54d also include a channel for receiving cooling fluid from the large cold plate 52 (e.g., the small plate 54a includes a channel 70a, the small plate 54b includes a channel 70b, the small plate 54c includes a channel 70c and the small plate 54d includes a channel 70d).

In one example, the boss 76a extends through the thermal spreader 34e and through the daughter card 32e and is secured at the RF interface card 24 either on or within the RF interface card as depicted by dotted line 78. In other examples not shown, the boss 76a extends through the RF interface card 24 and is secured either on or in the motherboard 20.

Though not shown in FIG. 3, the other bosses 76b-76d also extend into their respective thermal spreaders 34f-34h and daughter cards 32f-32h in a similar fashion as boss 76a. The bosses 76a-76d provide a hard stop to maintain antenna panel-to-antenna panel co-planarity necessary for RF performance and RF ground plane continuity. In other examples, the bosses 76b-76d are secured to the motherboard 20 and the RF interface board 24 in a similar fashion as boss 76a.

While bosses 76a-76d have been described one of ordinary skill in the art would recognize that the bosses may be replaced with fasteners (e.g., standoffs and so forth). Also, one of ordinary skill in the art would recognize other known methods or techniques to ensure contact between the cold plate assembly and the thermal spreaders (e.g., as shown in FIGS. 4A and 4B).

The hollow and flexible conduits 80a-80h connect the large cold plate 52 to each of the small cold plates 54a-54d. In one example, the cold plate 54a is connected to the large plate 52 by conduits 80a, 80b, the cold plate 54b is connected to the large cold plate 52 by conduits 80c, 80d, the cold plate 54c is connected to the large cold plate 52 by conduit 80e, 80f and the cold plate 54d is connected to the large cold plate 52 by conduits 80g, 80h. In one particular example, the conduits 80a-80h are configured to carry cooling fluid between the channel 60 and the channels 70a-70d.

The conduits 80a-80h provide flexibility to ensure intimate contact between the cold plate and thermal spreader to maximize thermal performance regardless of tolerances such as, for example, thickness, coplanarity and parallelism. In one example, one or more of the conduits 80a-80h may be a bellow, a hose, a sliding rigid tube or any combination thereof or some other flexible structure capable of carrying fluid (e.g., coolant).

Figure 4A:
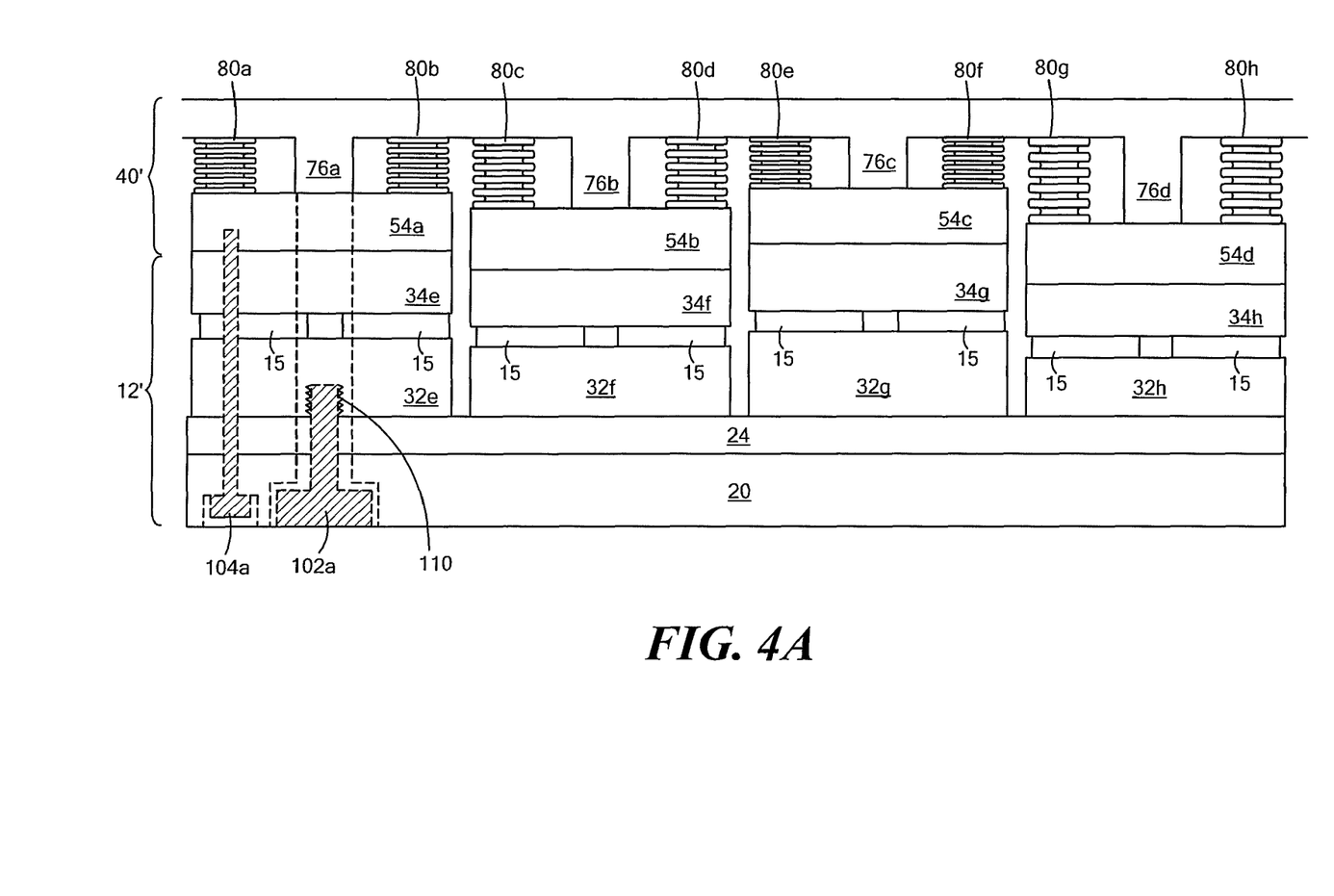
FIGS. 4A and 4B are cross-sectional views of the tile sub-array with different examples of cold plate assemblies.
Figure 4B:
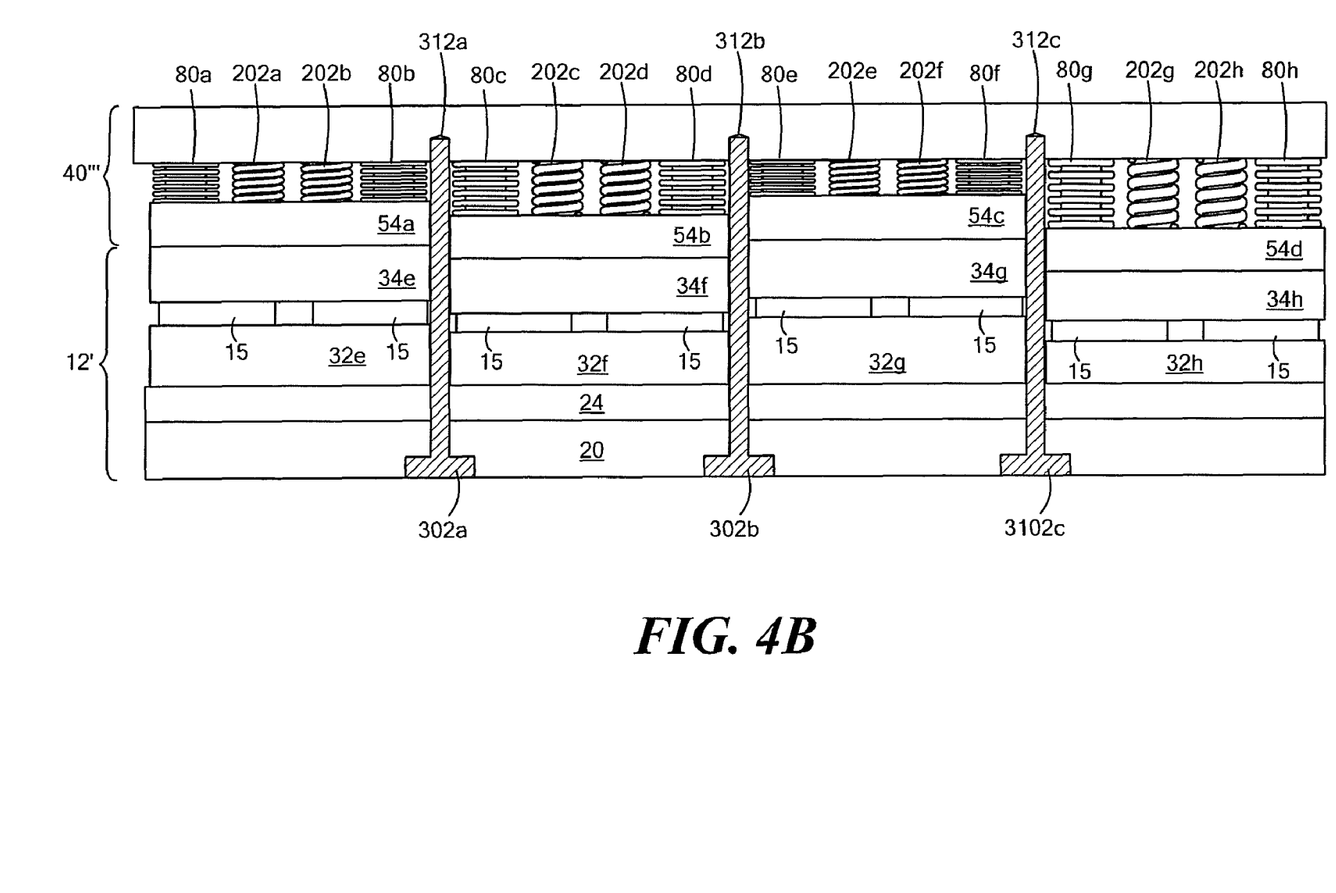

Referring to FIGS. 4A and 4B, in other cold plate assembly examples other or additional methods for securing the cold plate assemblies to the daughter card/active circuit/thermal spreader subassemblies may be used. For example, in FIG. 4A, a first set of fasteners, one for each daughter card/active circuit/thermal spreader subassembly, for example, may be used to secure the mother board 20, the RF interface board 24 and the daughter card/active circuit/thermal spreader assembly to a cold plate assembly 40'. An example of one of the first set of fasteners is a fastener 102a. The fastener 102a is used to secure the mother board 20 to the boss 76a. In one example, the fastener 102a is a threaded screw that engages corresponding threads 110 of the boss 76a. In other examples, other fasteners of the first set of fasteners (not shown in FIG. 4A) connect corresponding cold plates 54b-54d in a similar fashion as fastener 102a.

In addition, a second set of fasteners may also be used to secure the mother board 20 to the cold plate assembly 40'. An example of one of the second set of fasteners is a fastener 104a. The fastener 104a is used to secure the mother board 20 to the cold plate 54a. In one example, the fastener 104a is a threaded screw that engages corresponding threads 112 of the cold plate 54a.

In one example, the fastener 104a provides pressure (e.g., by pulling the layers together) on each of the thermal interfaces (e.g., the thermal interfaces between the cold plate 54a-54d and their respective thermal spreaders 34e-34h) to ensure efficient heat transfer away from the active circuits 15. Other fasteners of the second set of fasteners (not shown in FIG. 4A) connect corresponding cold plates 54b-54d in a similar fashion as fastener 104a.

Referring to FIG. 4B, fasteners 302a-302c (e.g., shoulder screws) and springs 202a-202h may be used together in a cold plate assembly 40'''. For example, the fasteners 302a-302c may be used to secure the motherboard 20 to the large cold plate 52. In one particular example, the fasteners 302a-302c are threaded and fastener 302a engages corresponding threads 312a of the cold plate 52, the fastener 302b engages corresponding threads 312b of the cold plate 52 and the fastener 302c engages corresponding threads 312c of the cold plate 52.

The processes described herein are not limited to the specific embodiments described. Elements of different embodiments described herein may be combined to form other embodiments not specifically set forth above. Other embodiments not specifically described herein are also within the scope of the following claims.

What is claimed is:

1. An active, electronically scanned array (AESA) panel architecture system comprising:
   a first daughter board comprising antenna elements;
   a first thermal spreader attached to the antenna elements of the first daughter board;
   a second daughter board comprising antenna elements;
   a second thermal spreader attached to the antenna elements of the second daughter board;
   a board assembly comprising:
      a mother board; and
      an RF interface board attached to the mother board and in direct contact with the first and second daughter boards;
   a cold-plate assembly in direct contact with the first thermal spreader and the second thermal spreader and comprising:
      a first cold-plate having a first channel configured to receive a cooling fluid;
      a second cold-plate having a second channel configured to receive the cooling fluid and in direct contact with the first thermal spreader;
      a third cold-plate having a third channel configured to receive the cooling fluid and in direct contact with the second thermal spreader;
      a first plurality of hollow and flexible conduits connecting the first and second cold-plates, each of the first plurality of hollow and flexible conduits configured to provide a path for the cooling fluid to flow between the first and second channels; and
      a second plurality of hollow and flexible conduits connecting the first and third cold-plates, each of the second plurality of hollow and flexible conduits configured to provide a path for the cooling fluid to flow between the first and third channels.

2. The system of claim 1 wherein at least one of the first plurality of hollow and flexible conduits is one of a flexible bellow, a hose or a sliding rigid tube.

3. The system of claim 1, further comprising a boss attached to the first member and extending through the daughter card, the thermal spreader to the board assembly.

4. The system of claim 3, wherein the boss includes threads, and further comprising a fastener secures the board assembly by engaging the threads of the boss.

5. The system of claim 1, further comprising a spring disposed between the first and second cold-plates.

6. The system of claim 5, wherein the first plate includes threads, and further comprising a fastener attaching the board assembly to the first cold-plate by engaging the threads on the first cold-plate.

* * * * *